(12) United States Patent
Uemura et al.

(10) Patent No.: US 6,861,281 B2
(45) Date of Patent: Mar. 1, 2005

(54) GROUP III NITRIDE COMPOUND SEMICONDUCTOR LIGHT-EMITTING DEVICE AND METHOD FOR PRODUCING THE SAME

(75) Inventors: Toshiya Uemura, Aichi (JP); Naohisa Nagasaka, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/296,290

(22) PCT Filed: Dec. 25, 2000

(86) PCT No.: PCT/JP00/09220

§ 371 (c)(1),
(2), (4) Date: Jul. 11, 2003

(87) PCT Pub. No.: WO01/91196

PCT Pub. Date: Nov. 29, 2001

(65) Prior Publication Data

US 2004/0087050 A1 May 6, 2004

(30) Foreign Application Priority Data

May 23, 2000 (JP) ........................................ 2000-150987

(51) Int. Cl.[7] .............................................. H01L 21/00
(52) U.S. Cl. ........................... 438/93; 438/149; 438/56; 257/103; 257/98
(58) Field of Search .............................. 438/56, 57, 69, 438/72, 149, 93; 257/85, 90, 98, 103

(56) References Cited

U.S. PATENT DOCUMENTS

| 4,966,862 | A | * | 10/1990 | Edmond ....................... 438/27 |
| 5,185,290 | A | | 2/1993 | Aoyagi et al. |
| 5,798,536 | A | | 8/1998 | Tsutsui |
| 5,915,194 | A | * | 6/1999 | Powell et al. ................ 438/478 |
| 6,121,636 | A | * | 9/2000 | Morita et al. ................. 257/99 |

FOREIGN PATENT DOCUMENTS

| JP | 49-149679 | 4/1973 |
| JP | 48-95181 | 12/1973 |
| JP | 51-137393 | 11/1976 |
| JP | 55-34646 | 8/1978 |
| JP | 58-33882 | 2/1983 |
| JP | 1-316459 | 12/1989 |
| JP | 5-110206 | 4/1993 |
| JP | 5-129658 | 5/1993 |
| JP | 8-102549 | * 4/1996 | ........... H01L/33/00 |
| JP | 11-126924 | 5/1999 |
| JP | 11-126925 | 5/1999 |
| JP | 11-145519 | 5/1999 |
| JP | 11-261112 | 9/1999 |

* cited by examiner

Primary Examiner—Caridad Everhart
(74) Attorney, Agent, or Firm—McGinn & Gibb, PLLC (57) ABSTRACT

A reflective layer 10 is formed on a back surface 11b of a sapphire substrate 11. The reflective layer 10 includes an extension portion 10a which extends so as to cover almost all the sidewalls 21a of a light-emitting device in the vicinity of the sapphire substrate. Thus, since adhesion between the reflective layer 10 and the substrate is greatly enhanced in the vicinity of the periphery of the surface on which the reflective layer is formed (the substrate back surface 11b) by virtue of formation of the aforementioned extension portion 10a, exfoliation of the reflective layer 10 from the substrate is prevented. Therefore, even when a process in which the reflective layer 10 is attached onto an adhesive sheet to thereby secure the light-emitting device 100 on the sheet is employed, generation of a defective product having an exfoliated reflective layer can be prevented. Thus, the quality and productivity of the semiconductor light-emitting device 100 including the reflective layer 10 provided for enhancing emission efficiency can be considerably improved. The sidewalls 21a may have a short-circuit-prevention groove-like portion for preventing excessive extension of the reflective layer 10.

20 Claims, 6 Drawing Sheets

GROUP III NITRIDE COMPOUND SEMICONDUCTOR LIGHT-EMITTING DEVICE AND METHOD FOR PRODUCING THE SAME

TECHNICAL FIELD

The present invention relates to a Group III nitride compound semiconductor light-emitting device and to a method for producing the light-emitting device; and more particularly to a Group III nitride compound semiconductor light-emitting device including a reflective layer which is formed on the back side of a substrate of the device in order to obtain light reflection effects, and to a method for producing the light-emitting device.

BACKGROUND ART

Conventional techniques in relation to Group III nitride compound semiconductor light-emitting devices in which a reflective layer is formed on the back side of a substrate in order to obtain light reflection effects and in relation to methods for producing such devices are disclosed in, for example, Japanese Patent Application Laid-Open (kokai) No. 11-126924 entitled "Method for Producing Gallium Nitride Compound Semiconductor Devices" and Japanese Patent Application Laid-Open (kokai) No. 11-126925, 5-129658, and 11-261112.

DISCLOSURE OF THE INVENTION

However, in a light-emitting device produced through such a conventional technique, sufficient adhesion between the substrate and the reflective layer formed on the back side of the substrate fails to be obtained. Therefore, the reflective layer may be exfoliated from the substrate during production of the light-emitting device or upon use of the device.

When a light-emitting device having such a reflective layer is produced through a production method including a step in which an adhesive sheet is attached onto the reflective layer to thereby secure a light-emitting device (or a semiconductor wafer including a plurality of light-emitting devices) on the adhesive sheet via mediation of the reflective layer, in some cases, a portion or the entirety of the reflective layer adheres to the adhesive sheet and is exfoliated from the substrate, resulting in poor productivity (yield).

The present invention has been accomplished in an attempt to solve the aforementioned problems, and an object of the present invention is to greatly improve productivity of a semiconductor light-emitting device by preventing exfoliation of a reflective layer.

In order to solve the aforementioned problems, the present invention provides the following.

Accordingly, an invention drawn to a first feature provides a Group III nitride compound semiconductor light-emitting device comprising a plurality of Group III nitride compound semiconductor layers which are formed through crystal growth, wherein a reflective layer which reflects light emitted from a light-emitting layer and which is formed on one surface of the light-emitting device, and the reflective layer has an extension portion which extends so as to partially cover a sidewall of the light-emitting device.

An invention drawn to a second feature provides a Group III nitride compound semiconductor light-emitting device as recited in connection with the first feature, wherein the extension portion is formed on almost the entire periphery of the surface on which the reflective layer is formed.

An invention drawn to a third feature provides a Group III nitride compound semiconductor light-emitting device as recited in connection with the first or second feature, wherein the sidewall has a short-circuit-prevention groove-like portion for preventing extension of the reflective layer.

An invention drawn to a fourth feature provides a Group III nitride compound semiconductor light-emitting device as recited in connection with the third feature, wherein the short-circuit-prevention groove-like portion is formed on almost the entire periphery of sidewalls of the light-emitting device.

An invention drawn to a fifth feature provides a Group III nitride compound semiconductor light-emitting device as recited in connection with any one of the first through fourth features, wherein the reflective layer has a multi-layer structure including at least one metallic layer.

An invention drawn to a sixth feature provides a Group III nitride compound semiconductor light-emitting device as recited in connection with the fifth feature, wherein the extension portion is formed of at least one of the layers constituting the multi-layer structure.

An invention drawn to a seventh feature provides a method for producing a Group III nitride compound semiconductor light-emitting device as recited in any one of the first through sixth features, which comprises a break step in which a semiconductor wafer including a plurality of light-emitting device main bodies is subjected to separation, to thereby form light-emitting device units; and an extension portion formation step of forming the reflective layer or extension portion, the extension portion formation step being performed after the break step, wherein, in the extension portion formation step, the light-emitting device units are disposed on a sheet at intervals of 0.1 μm to 500 μm inclusive, and reflective layers or extension portions for the respective light-emitting device units are formed simultaneously thereon through deposition or sputtering.

An invention drawn to an eighth feature provides a method for producing a Group III nitride compound semiconductor light-emitting device as recited in the seventh feature, wherein the outlet of a deposition source or a sputtering target from which the raw material for deposition or sputtering is fed is rotated by use of angle changing means, in one direction or in opposite directions within a certain angle range, relative to the sheet on which the light-emitting device units are disposed, and the outlet is offset from the center axis of rotation.

The aforementioned problems can be solved by the above-mentioned features of the present invention.

Since, by virtue of formation of the aforementioned extension portion, adhesion between the reflective layer and the substrate is greatly enhanced in the vicinity of the periphery of the surface on which the reflective layer is formed, the reflective layer is prevented from being peeled off starting from the periphery of the surface. Therefore, even when a process in which the reflective layer is attached onto an adhesive sheet to thereby secure the light-emitting device on the sheet is employed, generation of a defective product having an exfoliated reflective layer can be prevented.

Thus, the quality and productivity of a semiconductor light-emitting device or element including a reflective layer provided for enhancing emission efficiency can be greatly improved.

When the aforementioned short-circuit-prevention groove-like portion is formed, extension of a metallic layer constituting the reflective layer to semiconductor layers can be prevented. Therefore, short circuit between the reflective layer and the semiconductor layers can be reliably prevented.

The aforementioned reflective layer may have a multi-layer structure. The aforementioned extension portion is preferably formed through extension (i.e., extension to the sidewall of the light-emitting device) of at least one layer constituting the reflective layer. When the reflective layer has a multi-layer structure, preferably, at least one layer constituting the reflective layer is formed of a metallic layer which reflects light at high efficiency.

Preferably, the extension portion is formed on the entire periphery of the surface on which the reflective layer is formed. However, the extension portion is not necessarily formed so as to cover the entire periphery of the surface. Even when not the entire periphery of the surface is covered with the extension portion, by virtue of the aforementioned effects, productivity of the light-emitting element can be improved as compared with the case of a conventional light-emitting device.

Preferably, the aforementioned short-circuit-prevention groove-like portion is provided on all the sidewalls of the light-emitting device on which the extension portion is to be formed. However, depending on the shape of the light-emitting device and on conditions for forming the reflective layer (conditions for forming the extension portion), including arrangement of light-emitting device main bodies during deposition, the short-circuit-prevention groove-like portion is not necessarily formed on all the sidewalls of the light-emitting device. Even when the short-circuit-prevention groove-like portion is not formed on all the sidewalls, the aforementioned effects can be obtained.

In the extension portion formation step, preferably, a plurality of light-emitting device main bodies are disposed at intervals of about 0.1 $\mu$m to about 500 $\mu$m. More preferably, the light-emitting device main bodies are disposed at intervals of about 1 $\mu$m to about 50 $\mu$m.

When the intervals are excessively small, the resultant extension portion becomes very small, and thus exfoliation of the reflective layer tends to occur. In contrast, when the intervals are excessively large, the number of semiconductor chips (light-emitting device main bodies) disposed on the aforementioned sheet is reduced, and productivity of the light-emitting device is insufficiently improved in the course of mass-production thereof.

When the reflective layer (or the extension portion) is formed through, for example, deposition, a raw material of the reflective layer is fed radially and straight from the outlet of a deposition source. When the aforementioned sheet on which light-emitting device main bodies are disposed is rotated, and the outlet of the deposition source is offset from the rotation axis (direction) of the sheet, the extension portion can be readily formed so as to cover all the sidewalls of each of the light-emitting device main bodies. So long as the outlet of the deposition source and the sheet on which the light-emitting element main bodies are disposed are rotated relative to each other, either of the outlet and the sheet may be rotated, or both the outlet and the sheet may be rotated. The rotation may be performed in one direction or in opposite directions within an angle range of about 200 to about 300°.

Through use of such angle changing means, the aforementioned extension portion can be readily and reliably formed on almost all the sidewalls of the light-emitting device.

When the aforementioned reflective layer is formed of, for example, aluminum (Al) or silver (Ag), high reflectivity can be obtained. The reflective layer may be formed of at least one selected from the group consisting of rhodium (Rh), ruthenium (Ru), platinum (Pt), gold (Au), copper (Cu), palladium (Pd), chromium (Cr), nickel (Ni), cobalt (Co), titanium (Ti), indium (In), molybdenum (Mo), or an alloy containing at least one of these metallic elements.

The reflective layer may be formed of half mirror, white inorganic film of $SiO_2$, or white paint.

The thickness of the reflective layer is preferably 5 nm to 20 $\mu$m inclusive. The thickness of the reflective layer, which somewhat depends on the type of metal to be employed, is more preferably about 30 to about 1,000 nm, much more preferably about 50 to about 500 nm. When the thickness of the reflective layer is excessively small, reflectivity is lowered, whereas when the thickness is excessively large, film formation costs (costs in relation to metallic material, film formation time, etc.) are increased.

The reflective layer may have a multi-layer structure in which a layer formed of, for example, aluminum or silver is sandwiched between two layers formed of, for example, alumina ($Al_2O_3$). Alumina is employed as a material exhibiting excellent light transmission or transparency, corrosion resistance, and adhesion to, for example, a metal or a sapphire substrate. Therefore, when the reflective layer has the aforementioned multi-layer structure, the reflective layer exhibits excellent reflectivity, adhesion, and corrosion resistance.

Examples of materials which may be employed and which exhibit excellent light transmission or transparency, corrosion resistance, and adhesion to, for example, a metal or a sapphire substrate include, in addition to alumina, metal oxides such as $TiO_2$, $MgO$, $MgCO_3$, $Ta_2O_5$, $ZnO$, $In_2O_3$, $SiO_2$, $SnO_2$, and $ZrO_2$; and ceramic.

The substrate on which semiconductor crystals are grown may be formed of, for example, sapphire, spinel, silicon, silicon carbide, zinc oxide, gallium phosphide, gallium arsenide, magnesium oxide, manganese oxide, lithium gallium oxide ($LiGaO_2$), or molybdenum sulfide (MoS).

The aforementioned effects are obtained in at least a Group III nitride compound semiconductor light-emitting/light-receiving device (e.g., LED) including laminated semiconductor layers formed of a binary, ternary, or quaternary semiconductor represented by $Al_xGa_yIn_{1-x-y}N$ (wherein $0 \leq x \leq 1$, $0 \leq y \leq 1$, and $0 \leq x+y \leq 1$). Group III elements may be partially replaced with boron (B) or thallium (Tl), and nitrogen (N) atoms may be completely or partially replaced with phosphorus (P), arsenic (As), antimony (Sb), or bismuth (Bi).

BEST MODE FOR CARRYING OUT THE INVENTION

Embodiments of the present invention will next be described with reference to the drawings. Characteristic features of the present invention have been described above, and the present invention is not limited to the below-described specific embodiments.

First Embodiment

Figure 1:
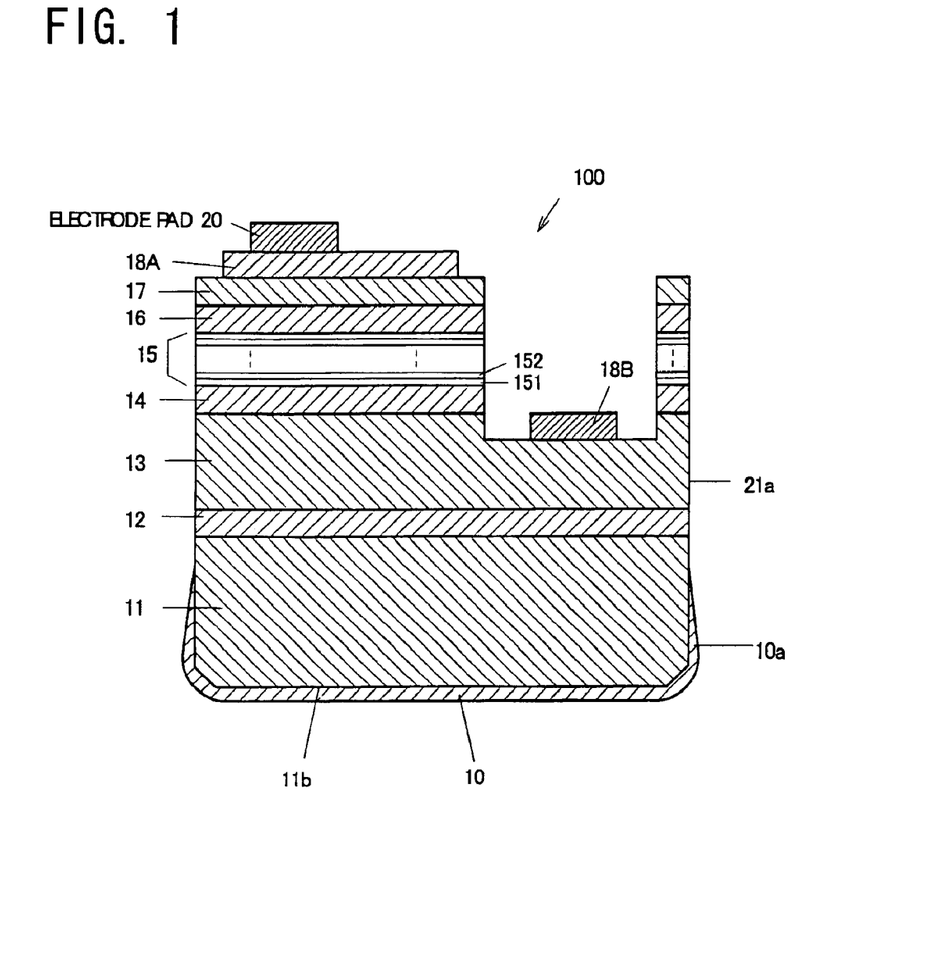
FIG. 1 is a schematic cross-sectional view showing a Group III nitride compound semiconductor light-emitting device 100 according to a first embodiment of the present invention.

FIG. 1 is a schematic cross-sectional view showing a Group III nitride compound semiconductor light-emitting device (or element) 100 according to a first embodiment of the present invention (hereinafter the light-emitting device 100 may be simply referred to as "semiconductor light-emitting device 100" or "device 100"). A characteristic feature of the light-emitting device 100 resides in the structure of a reflective layer 10 for reflecting light, which is formed on a back surface 11b of a sapphire substrate 11.

Specifically, the semiconductor light-emitting device 100 of the first embodiment has a structure as described below.

The substrate 11 has a approximately square shape. An aluminum nitride (AlN) buffer layer 12 (thickness: about 25 nm) is formed on the substrate 11, and a silicon (Si)-doped GaN high-carrier-concentration n$^+$ layer 13 (n-type contact layer 13) (thickness: about 4.0 $\mu$m) is formed on the buffer layer 12. An Si-doped n-type GaN cladding layer 14 (thickness: about 0.5 $\mu$m) is formed on the high-carrier-concentration n$^+$ layer 13 (n-type contact layer 13).

A light-emitting layer 15 is formed on the n-type cladding layer 14. The light-emitting layer 15 has a multi-quantum well (MQW) structure including five $Ga_{0.8}In_{0.2}N$ well layers 151 (each having a thickness of about 35 Å) and four GaN barrier layers 152 (each having a thickness of about 35 Å), the well layers and barrier layers being laminated alternately. A p-type $Al_{0.15}Ga_{0.85}N$ cladding layer 16 (thickness: about 50 nm) is formed on the light-emitting layer 15. A p-type GaN contact layer 17 (thickness: about 100 nm) is formed on the p-type cladding layer 16.

A light-transmittable or light-transparency positive electrode 18A is formed on the p-type contact layer 17 through metal deposition, and a negative electrode 18B is formed on the n$^+$ layer 13. The light-transmittable positive electrode 18A includes a cobalt (Co) layer (thickness: about 15 Å) which is connected to the p-type contact layer 17, and a gold (Au) layer (thickness: about 60 Å) which is connected to the Co layer. The negative electrode 18B includes a vanadium (V) layer (thickness: about 200 Å), and a layer (thickness: about 1.8 $\mu$m) formed of aluminum (Al) or an Al alloy. An electrode pad 20 (thickness: about 1.5 $\mu$m) is formed on a portion of the positive electrode 18A. The electrode pad 20 is formed of vanadium (V), and Au, Al, or an alloy thereof.

The reflective layer 10 is formed on the back surface 11b of the substrate 11. The reflective layer 10 includes an extension portion 10a which extends so as to cover almost all the sidewalls 21a of the light-emitting element in the vicinity of the sapphire substrate. The structure and production method of the reflective layer 10 are described below in detail.

The production method for the light-emitting device 100 will next be described.

The light-emitting device 100 was produced through metal-organic vapor phase epitaxy (hereinafter called "MOVPE"). The following gasses were employed: ammonia ($NH_3$), carrier gas ($H_2$ or $N_2$), trimethylgallium (Ga($CH_3$)$_3$, hereinafter called "TMG"), trimethylaluminum (Al($CH_3$)$_3$, hereinafter called "TMA"), trimethylindium (In($CH_3$)$_3$, hereinafter called "TMI"), silane ($SiH_4$), and cyclopentadienylmagnesium (Mg($C_5H_5$)$_2$, hereinafter called "$CP_2Mg$").

Firstly, a monocrystalline substrate 11 having an a-plane as a primary crystal plane was cleaned by organic cleaning and heat treatment, and the substrate 11 was mounted on a susceptor provided in a reaction chamber of an MOVPE apparatus. Subsequently, the substrate 11 was baked at 1,100° C. while $H_2$ was caused to flow through the reaction chamber at ambient pressure.

Subsequently, the temperature of the substrate 11 was lowered to 400° C., and $H_2$, $NH_3$, and TMA were fed, to thereby form an AlN buffer layer 12 (thickness: about 25 nm) on the substrate 11.

Subsequently, while the temperature of the substrate 11 was maintained at 1,150° C., $H_2$, $NH_3$, TMG, and silane were fed, to thereby form a GaN high-carrier-concentration n$^+$ layer 13 (thickness: about 4.0 $\mu$m, electron concentration: 2×10$^{18}$/cm$^3$).

Subsequently, while the temperature of the substrate 11 was maintained at 1,150° C., $N_2$ or $H_2$, $NH_3$, TMG, TMA, and silane were fed, to thereby form a GaN cladding layer 14 (thickness: about 0.5 $\mu$m, electron concentration: 1×10$^{18}$/cm$^3$).

After the cladding layer 14 was formed, $N_2$ or $H_2$, $NH_3$, TMG, and TMI were fed, to thereby form a $Ga_{0.8}In_{0.2}N$ well layer 151 (thickness: about 35 Å). Subsequently, $N_2$ or $H_2$, $NH_3$, and TMG were fed, to thereby form a GaN barrier layer 152 (thickness: about 35 Å). Formation of the well layer 151 and formation of the barrier layer 152 were repeated under the aforementioned conditions, to thereby form a light-emitting layer 15 having an MQW structure.

Subsequently, while the temperature of the substrate 11 was maintained at 1,100° C., $N_2$ or $H_2$, $NH_3$, TMG, TMA, and $CP_2Mg$ were fed, to thereby form a magnesium (Mg)-doped p-type $Al_{0.15}Ga_{0.85}N$ cladding layer 16 (thickness: about 50 nm).

Subsequently, while the temperature of the substrate 11 was maintained at 1,100° C., $N_2$ or $H_2$, $NH_3$, TMG, and $CP_2Mg$ were fed, to thereby form an Mg-doped p-type GaN contact layer 17 (thickness: about 100 nm).

Subsequently, an etching mask was formed on the contact layer 17, and a predetermined region of the mask was removed. Thereafter, in a region which was not covered with the mask, the contact layer 17, the cladding layer 16, the light-emitting layer 15, the cladding layer 14, and a portion of the n$^+$ layer 13 were subjected to reactive ion etching by use of a gas containing chlorine, to thereby expose the surface of the n$^+$ layer 13.

Subsequently, through the below-described procedure, an electrode 18B was formed on the n$^+$ layer 13, and a light-transmittable electrode 18A was formed on the contact layer 17.

(1) A photoresist was applied onto the exposed surface of the n$^+$ layer 13, a window was formed at a predetermined region on the exposed surface through photolithography, and the deposition apparatus was evacuated to 10$^{-6}$ Torr or less.

Thereafter, a vanadium (V) layer (thickness: about 200 Å) and an Al layer (thickness: about 1.8 µm) were formed through deposition. Subsequently, the photoresist was removed, to thereby form the electrode 18B on the exposed surface of the n⁺ layer 13.

(2) Subsequently, a photoresist was uniformly applied onto the contact layer 17, and the photoresist that had been applied onto a region of the contact layer 17 on which an electrode was to be formed was removed through photolithography, to thereby form a window.

(3) The deposition apparatus was evacuated to $10^{-6}$ Torr or less, and subsequently a Co layer (thickness: about 15 Å) was deposited onto the remaining photoresist and the exposed surface of the contact layer 17, and an Au layer (thickness: about 60 Å) was formed on the Co layer.

(4) Subsequently, the resultant sample was removed from the deposition apparatus, and the Co and Au layers that had been deposited onto the photoresist were removed through a lift-off method, to thereby form the light-transmittable electrode 18A on the contact layer 17.

(5) Subsequently, in order to form an electrode pad 20 for bonding on a portion of the light-transmittable electrode 18A, a photoresist was uniformly applied onto the electrode 18A, and a window was formed at a region of the photoresist on which the electrode pad 20 was to be formed. Subsequently, vanadium (V), and Au, Al, or an alloy thereof were deposited onto the photoresist and the exposed surface of the electrode 18A, to thereby form a layer (thickness: about 1.5 µm). Thereafter, in a manner similar to that of (4) above, the layer of vanadium (V), and Au, Al, or an alloy thereof deposited onto the photoresist was removed through a lift-off method, to thereby form the electrode pad 20.

(6) Thereafter, the chamber in which the resultant sample was placed was evacuated by use of a vacuum pump, and subsequently $O_2$ gas was fed to the chamber, to thereby regulate the pressure of the chamber to 10 and some Pa. Thereafter, the temperature of the chamber was maintained at about 550° C., and the sample was heated for about three minutes, to thereby lower the resistances of the p-type contact layer 17 and the p-type cladding layer 16, as well as to perform alloying of the contact layer 17 and the electrode 18A and alloying of the n⁺ layer 13 and the electrode 18B.

Thus, a large number of semiconductor chips (i.e., the light-emitting devices 100 having no reflective layer and having no sidewall (separation groove)) having the common sapphire substrate were produced. Hereinafter, the semiconductor chips having the common sapphire substrate will be collectively called a "semiconductor wafer 200."

A method for separation of the light-emitting devices 100 and a method for forming a reflective layer 10 will next be described with reference to FIGS. 2 through 5.

The thus-produced semiconductor wafer 200 was subjected to dicing from the top side (i.e., the side containing the electrode pad), to thereby form separation grooves 21 such that the bottoms of the grooves reached the substrate 11 (separation groove formation step). The depth of each of the separation grooves 21 is about 10 µm to about 20 µm.

Subsequently, the substrate back surface 11b of the semiconductor wafer 200 including light-emitting device units which were semi-separated by the separation grooves 21 was subjected to polishing by use of an abrasive disk, to thereby reduce the thickness of the substrate 11 (thickness reduction step). Portions of the substrate 11 corresponding to the separation grooves 21 have such a small thickness that the separation grooves 21 can be visually observed from the substrate back surface 11b.

Figure 2:
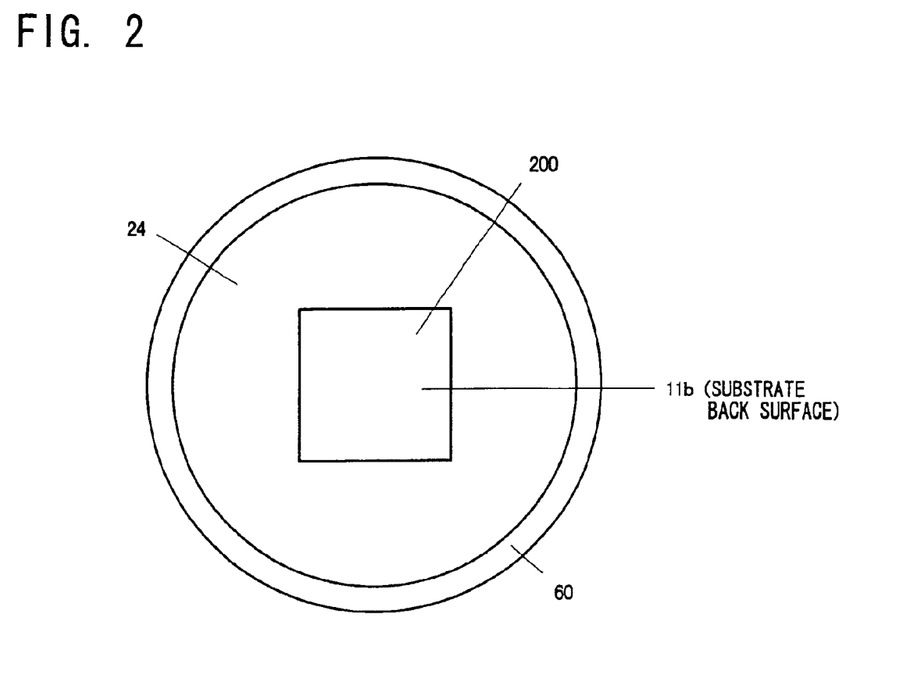
FIG. 2 is a schematic plan view of a semiconductor wafer 201 after an attachment step (before a scribing step) of the first embodiment of the present invention, as viewed from a substrate back surface 11b.

Subsequently, an adhesive sheet 24 supported by a stainless steel support ring 60 was attached on the electrode pads formed surface, to thereby produce a structure shown in FIG. 2 (attachment step). FIG. 2 is a schematic plan view of the semiconductor wafer 200 having the adhesive sheet 24 (hereafter called "semiconductor wafer 201") after the attachment step.

Figure 3:
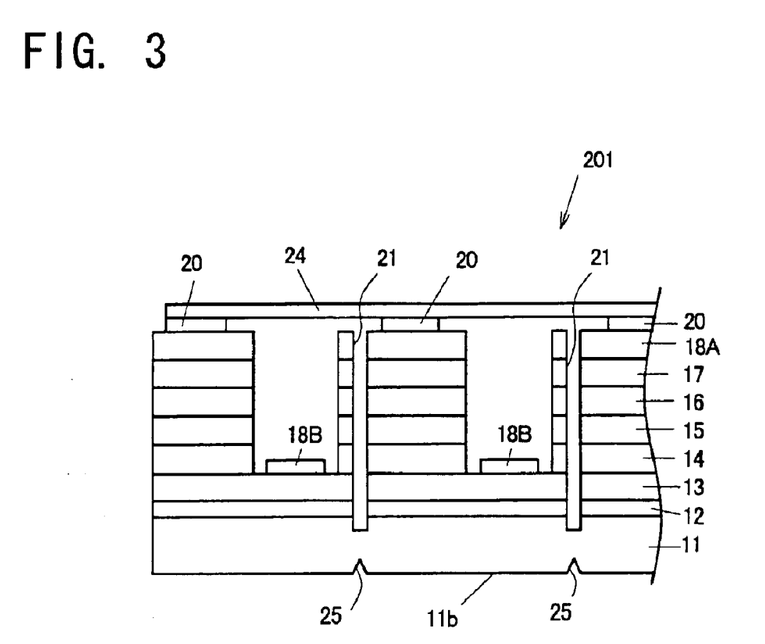
FIG. 3 is a schematic cross-sectional view of the semiconductor wafer 201 for illustrating the scribing step of the first embodiment of the present invention.

Subsequently, the substrate back surface 11b was subjected to scribing along the separation groove 21 by use of a scriber, to thereby form scribing lines 25 (scribing step). FIG. 3 is a schematic cross-sectional view of the semiconductor wafer 201 of the first embodiment after the scribing step.

Figure 4:
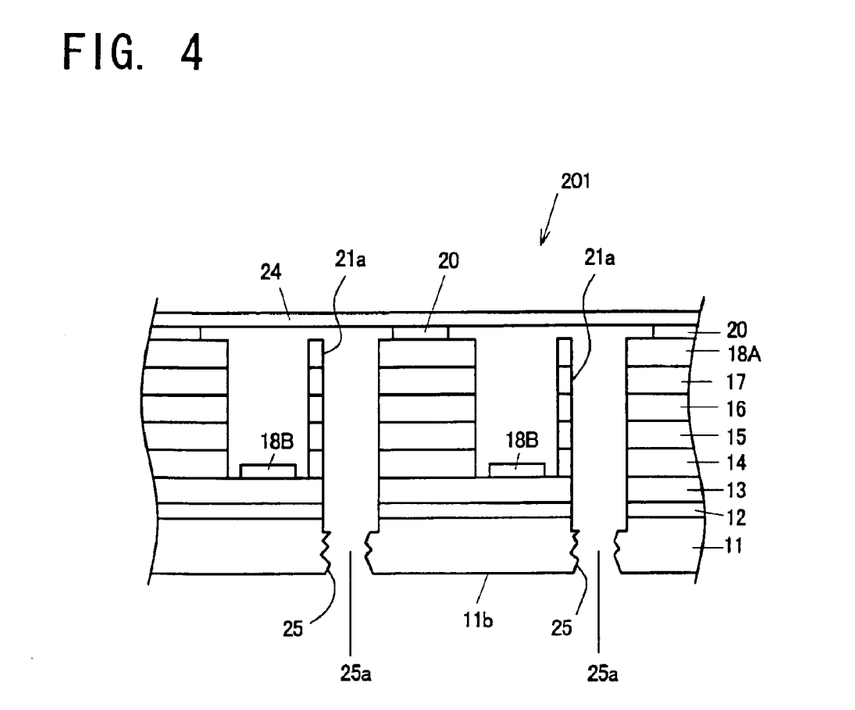
FIG. 4 is a schematic cross-sectional view of the semiconductor wafer 201 for illustrating a break step and an expansion step of the first embodiment of the present invention.

Subsequently, load was applied to the vicinity of the scribing lines by use of a breaking apparatus, to thereby separate the semiconductor wafer 201 into semiconductor chip units (break step). Thereafter, the adhesive sheet 24 was uniformly expanded in the vertical and horizontal directions (expansion step), to thereby produce a structure shown in FIG. 4. FIG. 4 is a schematic cross-sectional view of the semiconductor wafer 201 after the expansion step. In this case, intervals 25a between the semiconductor chips were regulated to about 10 µm.

Subsequently, a reflective layer 10 was formed on the substrate back surface 11b by deposition.

Figure 5:
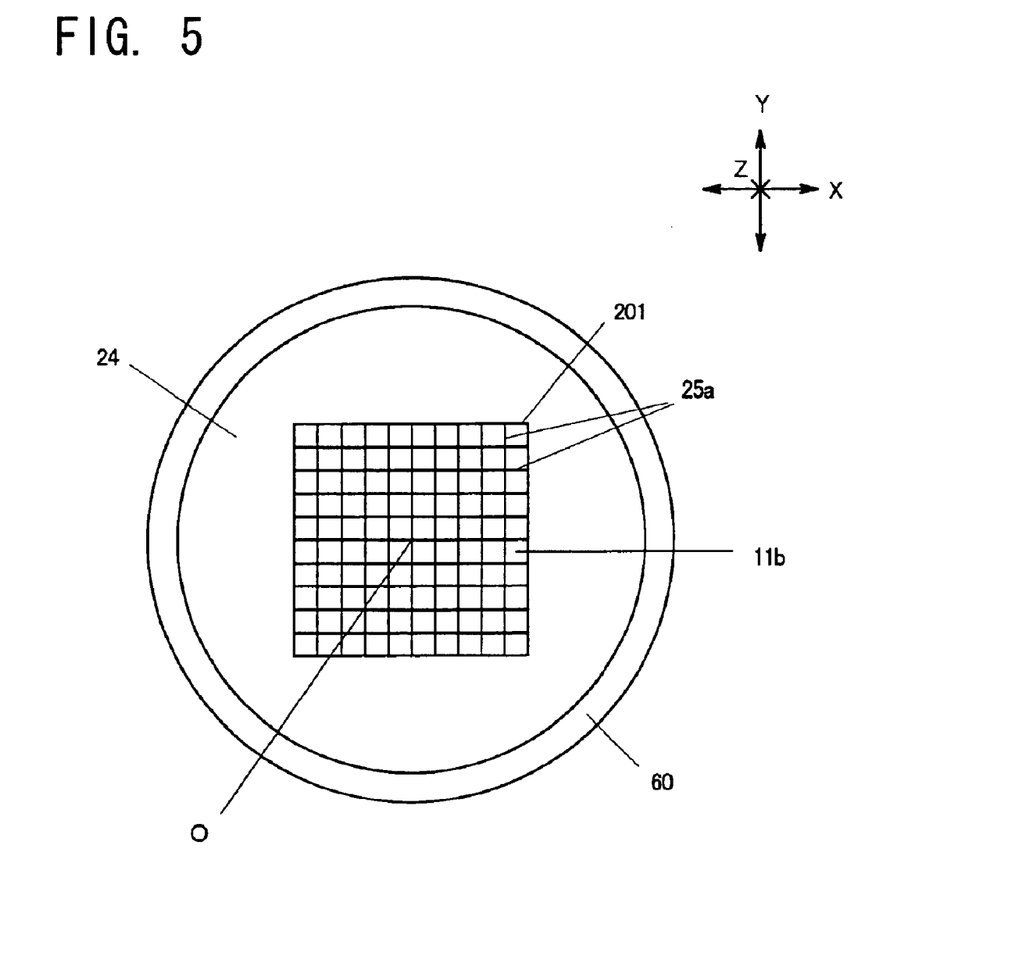
FIG. 5 is a schematic plan view of the semiconductor wafer 201 after the expansion step (before a deposition step) of the first embodiment of the present invention, as viewed from the substrate back surface 11b.

FIG. 5 is a schematic plan view of the semiconductor wafer 201 after the expansion step shown in FIG. 4 (before a deposition step), as viewed from the substrate back surface 11b. After the aforementioned expansion step, as shown in FIG. 5, the semiconductor wafer 201 is somewhat expanded in the vertical and horizontal directions.

The process for forming the reflective layer 10 will next be described with reference to FIG. 5. In order to explain the process, as shown in FIG. 5, there is employed a right-handed coordinate system in which the substrate back surface 11b is taken as the xy-plane (Z=0), and the center of the support ring 60 is taken as the origin O. The complementary latitude (polar distance) as measured from the z-axis (z≧0) is represented by "θ," and the longitude as measured from the xz-plane (y=0) toward the yz-plane (x=0) is represented by "φ." The coordinates of the position of a deposition source (r, θ, φ) are preferably regulated so as to satisfy the below-described expressions (1) through (3).

In this case, "r" represents the distance between the deposition source and the origin O, and "R" represents the radius of the support ring 60. Unlike the case shown in FIG. 5, when the size of the semiconductor wafer 201 is considerably smaller than that of the support ring 60, "r" and "R" do not necessarily satisfy the relation of expression (1).

(E1)

$$r \geq R \quad (1)$$

(E2)

$$\pi/30 \leq \theta \leq \pi/3 \quad (2)$$

(E3)

$$0 \leq \phi \leq 2\pi \quad (3)$$

For example, firstly, the position of the deposition source is fixed at (4R, π/4, 0). Subsequently, while the support ring 60 is fixed on a plane in the aforementioned coordinate system, the deposition source is rotated about the z-axis once (0≦φ≦2π) during the course of deposition. When the reflective layer 10 is formed on the substrate back surface 11b of the light-emitting device 100 through vacuum deposition while the position of the deposition source is varied by use of such angle changing means, as shown in FIG. 1, the extension portion 10a is formed so as to cover the entire periphery of the sidewalls 21a of the light-emitting device 100.

So long as the deposition source is rotated relative to the substrate back surface 11b, the support ring 60 may be rotated about the z-axis while the deposition source is fixed at a point in the coordinate system. Even in such a case, the aforementioned effects can be obtained.

Thus, the reflective layer 10 having the extension portion 10a shown in FIG. 1 was formed (reflective layer formation step).

When the extension portion 10a is formed on the sidewalls 21a of the light-emitting device, the reflective layer 10 strongly adheres to the substrate 11 in the vicinity of the periphery of the substrate back surface 11b. Therefore, even when an adhesive sheet is attached onto the reflective layer 10, the reflective layer 10 is not exfoliated from the substrate back surface 11b. Thus, generation of a defective product due to exfoliation of the reflective layer 10 during production of the light-emitting device can be completely prevented, and productivity of the light-emitting device can be considerably improved.

Preferably, the reflective layer 10 is formed after the expansion step. However, the expansion step may be omitted, and the deposition step (i.e., reflective layer formation step) may be performed after the break step.

For example, in the case where the width and depth of each of the scribing lines 25 are about 1 µm or more, even when the expansion step is not performed after the break step, adhesion between the substrate and the reflective layer 10 (extension portion 10a) in the vicinity of the periphery of the substrate back surface 11b of the light-emitting device 100 can be improved to a level such that acceptable exfoliation prevention effects are obtained.

Second Embodiment

Figure 6:
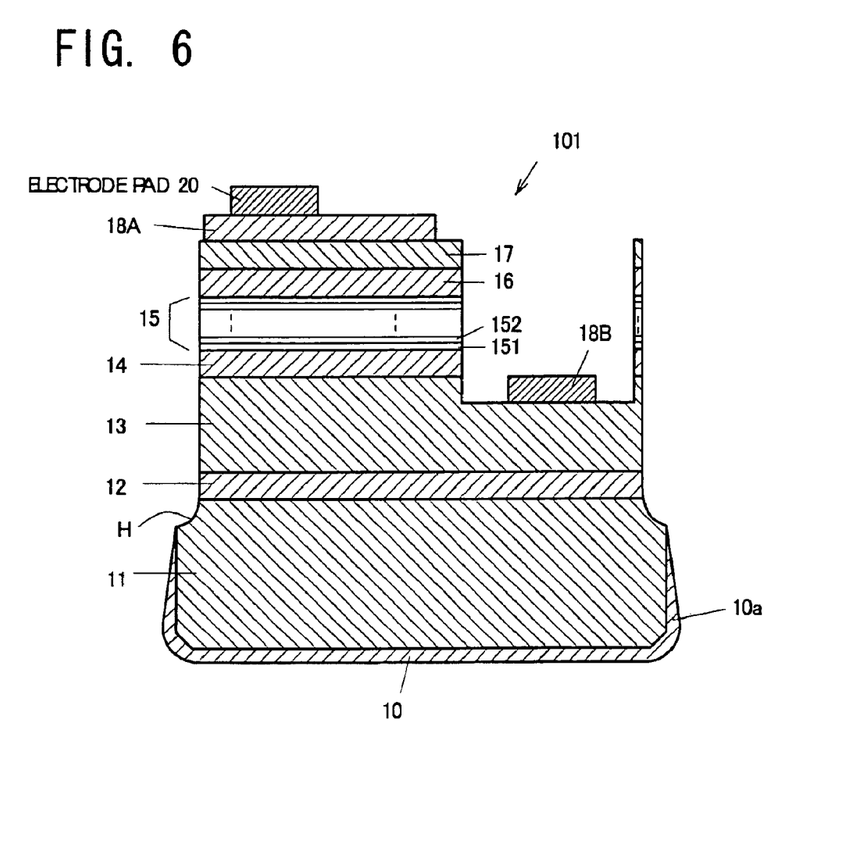
FIG. 6 is a schematic cross-sectional view showing a Group III nitride compound semiconductor light-emitting device 101 according to a second embodiment of the present invention.

In order to prevent short circuit as a result of excessive extension of the extension portion 10a, a short-circuit-prevention groove-like portion for preventing the extension may be formed on at least a portion of the sidewalls 21a of the light-emitting device 100. FIG. 6 is a schematic cross-sectional view showing a Group III nitride compound semiconductor light-emitting device 101 according to a second embodiment of the present invention, the device 101 having a short-circuit-prevention groove-like portion H.

When the short-circuit-prevention groove-like portion H is formed, extension of a metallic layer constituting the reflective layer 10 (extension portion 10a) on the sidewalls 21a to the vicinity of semiconductor layers can be prevented. Therefore, short circuit between the reflective layer and the electrodes can be reliably prevented.

Preferably, the short-circuit-prevention groove-like portion H is provided on all the sidewalls on which the extension portion 10a is to be formed. However, depending on the shape of the light-emitting device and on conditions for forming the reflective layer (conditions for forming the extension portion), including arrangement of light-emitting device main bodies during deposition, the short-circuit-prevention groove-like portion is not necessarily formed on all the sidewalls on which the extension portion is to be formed.

In each of the aforementioned embodiments, the reflective layer 10 of the light-emitting device 100 or 101 has a single-layer structure. However, the reflective layer formed on the substrate may have a multi-layer structure including at least one metallic layer, and the metallic layer may have a multi-layer structure. When the reflective layer has such a structure, its high reflectivity and corrosion resistance can be maintained, and adhesion between the substrate and the reflective layer can be improved.

In each of the aforementioned embodiments, the light-emitting element 100 or 101 has the substrate 11. However, since the substrate is not an essential component of the light-emitting device of the present invention, the substrate may be omitted. Instead of being formed of a metallic layer, the reflective layer 10 may be formed of half mirror, white inorganic film of $SiO_2$, or white paint.

In each of the aforementioned embodiments, the light-emitting layer 15 of the light-emitting device 100 or 101 has an MQW structure. However, the light-emitting layer 15 may have an SQW structure; or may be formed of a single layer of, for example, $Ga_{0.8}In_{0.2}N$, or a binary, ternary, or quaternary semiconductor represented by AlGaInN having arbitrary compositional proportions. Although Mg is employed as a p-type impurity in the embodiments, a Group II element such as beryllium (Be) or zinc (Zn) may be employed.

The present invention can be applied to light-emitting devices such as LEDs and LDs, and to light-receiving devices.

What is claimed is:

1. A Group III nitride compound semiconductor light-emitting device comprising:
    a plurality of Group III nitride compound semiconductor layers which are formed through crystal growth
    a reflective layer, which reflects light emitted from a light-emitting layer, formed on one surface of the light-emitting device, the reflective layer comprising an extension portion which extends so as to partially cover a sidewall of the light-emitting device; and
    a short-circuit-prevention groove-like portion formed on the sidewall for preventing extension of the reflective layer.

2. A Group III nitride compound semiconductor light-emitting device according to claim 1, wherein the extension portion is formed on substantially the entire periphery of the surface on which the reflective layer is formed.

3. A Group III nitride compound semiconductor light-emitting device according to claim 1, wherein the short-circuit-prevention groove-like portion is formed on substantially the entire periphery of sidewalls of the light-emitting device.

4. A Group III nitride compound semiconductor light-emitting device according to claim 1, wherein the reflective layer comprises a multi-layer structure including at least one metallic layer.

5. A Group III nitride compound semiconductor light-emitting device according to claim 4, wherein the extension portion comprises at least one layer of the layers constituting the multi-layer structure.

6. A Group III nitride compound semiconductor light-emitting device according to claim 2, wherein the reflective layer comprises a multi-layer structure including at least one metallic layer.

7. A Group III nitride compound semiconductor light-emitting device as recited in claim 1, wherein said reflective layer comprises a thickness of 5 nm to 20 µm.

8. A Group III nitride compound semiconductor light-emitting device as recited in claim 7, wherein said reflective layer comprises a thickness of 50 nm to 500 nm.

9. A method for producing a Group III nitride compound semiconductor light-emitting device comprising a plurality of Group III nitride compound semiconductor layers which are formed through crystal growth, wherein a reflective layer which reflects light emitted from a light-emitting layer and which is formed on one surface of the light-emitting device and the reflective layer includes an extension portion which extends so as to partially cover a sidewall of the light-emitting device, said method comprising:

separating a semiconductor wafer including a plurality of light-emitting device main bodies, to thereby form light-emitting device units; and forming the reflective layer or extension portion, said forming the reflective layer or extension portion being performed after said separating, wherein, in said forming the reflective layer or extension portion, the light-emitting device units are disposed on a sheet at intervals of 0.1 mm to 500 mm inclusive, and reflective layers or extension portions for the respective light-emitting device units are formed simultaneously thereon through deposition or sputtering.

10. A method for producing a Group III nitride compound semiconductor light-emitting device according to claim 9, wherein the outlet of at least one of a deposition source and a sputtering target, from which the raw material for at least one of deposition and sputtering is fed, is rotated by use of an angle changing means, in one direction or in opposite directions within a certain angle range, relative to the sheet on which the light-emitting device units are disposed, and the outlet is located offset from the center axis of rotation.

11. A Group III nitride compound semiconductor light-emitting device according to claim 3, wherein the reflective layer comprises a multi-layer structure including at least one metallic layer.

12. A method for producing a Group III nitride compound semiconductor light-emitting device as recited in claim 9, wherein the extension portion is formed on substantially the entire periphery of the surface on which the reflective layer is formed.

13. A method for producing a Group III nitride compound semiconductor light-emitting device as recited in claim 9, wherein the sidewall comprises a short-circuit-prevention groove-like portion for preventing extension of the reflective layer.

14. A method for producing a Group III nitride compound semiconductor light-emitting device as recited in claim 9, wherein the short-circuit-prevention groove-like portion is formed on substantially the entire periphery of sidewalls of the light-emitting device.

15. A method for producing a Group III nitride compound semiconductor light-emitting device as recited in claim 9, wherein the reflective layer comprises a multi-layer structure including at least one metallic layer.

16. A method for producing a Group III nitride compound semiconductor light-emitting device as recited in claim 9, wherein said reflective layer comprises a thickness of 5 nm to 20 $\mu$m.

17. A method for producing a Group III nitride compound semiconductor light-emitting device as recited in claim 16, wherein said reflective layer comprises a thickness of 50 nm to 500 nm.

18. A method for producing a Group III nitride compound semiconductor light-emitting device as recited in claim 15, wherein the extension portion comprises at least one layer of the layers constituting the multi-layer structure.

19. A method for producing a Group III nitride compound semiconductor light-emitting device as recited in claim 12, wherein the sidewall comprises a short-circuit-prevention groove-like portion for preventing extension of the reflective layer.

20. A method for producing a Group III nitride compound semiconductor light-emitting device as recited in claim 19, wherein the short-circuit-prevention groove-like portion is formed on substantially the entire periphery of the sidewalls of the light-emitting device.

* * * * *